United States Patent [19]
Shimoyama et al.

[11] Patent Number: 5,868,834
[45] Date of Patent: Feb. 9, 1999

[54] METHOD OF MANUFACTURING A GROUP II-VI COMPOUND SEMICONDUCTOR

[75] Inventors: Kenji Shimoyama, Tsuchiura; Toshinari Fujimori, Inashiki; Hideki Goto, Tsuchiura, all of Japan

[73] Assignee: Mitsubishi Kasei Corporation, Tokyo, Japan

[21] Appl. No.: 876,228

[22] Filed: Jun. 16, 1997

Related U.S. Application Data

[63] Continuation of Ser. No. 260,178, Jun. 15, 1994, abandoned.

[30] Foreign Application Priority Data

Jun. 22, 1993 [JP] Japan .................................. 5-174837
Jun. 22, 1993 [JP] Japan .................................. 5-174838

[51] Int. Cl.⁶ .................................................. C30B 25/00
[52] U.S. Cl. ........................... 117/104; 117/89; 117/93
[58] Field of Search .......................... 117/1, 2, 5, 6, 117/9, 89, 93, 104

[56] References Cited

U.S. PATENT DOCUMENTS

| | | | |
|---|---|---|---|
| 4,058,430 | 11/1977 | Suntola et al. | 427/255 |
| 4,629,514 | 12/1986 | Suda | 148/1.5 |
| 5,037,775 | 8/1991 | Reisman | 437/89 |
| 5,153,889 | 10/1992 | Sugawara et al. | 372/45 |
| 5,212,113 | 5/1993 | Azoulay et al. | 437/107 |

FOREIGN PATENT DOCUMENTS 2192198  1/1988  United Kingdom .

OTHER PUBLICATIONS

A. Yoshikawa et al, *Japanese Journal of Applied Physics*, 25(5): 673–678 (1986).
S. Yamauchi et al, *Japanese Journal of Applied Physics*, 26(6): L893–L895 (1987).
A. Yoshikawa et al, *Japanese Journal of Applied Physics*, 27(10): L1948–L1951 (1988).
N. Shibata et al, *Japanese Journal of Applied Physics*, 27(2): L251–L253 (1988).

*Primary Examiner*—Felisa Garrett
*Attorney, Agent, or Firm*—David G. Conlin; Peter F. Corless; Christine C. O'Day

[57] ABSTRACT

The disclosure describes a method of manufacturing a Group II–VI compound semiconductor thin film by a vapor-phase epitaxy using an organic metal compound of Group II element and a hydride or an organic metal compound of Group VI element as the raw material, which comprises repeating alternate introduction of an organic metal compound of Group II element and a halide gas, a halogen gas or a mixture thereof; or adding a halide gas, a halogen gas or a mixture thereof to a gas for vapor-phase epitaxy.

12 Claims, 6 Drawing Sheets

METHOD OF MANUFACTURING A GROUP II-VI COMPOUND SEMICONDUCTOR

This application is a continuation of application(s) Ser. No. 08/260,178 filed on Jun. 15, 1994, now abandoned.

BACKGROUND OF THE INVENTION

The present invention relates to a method of manufacturing a Group II–IV compound semiconductor by a vapor-phase epitaxy and, more in particular, it relates to a method of manufacturing a Group II–IV compound semiconductor suitable to flattening of an epitaxial growth layer and preventing of deposition to a protection film for selective epitaxial growth.

Group II–VI compound semiconductors can oscillate laser covering a short wavelength region from ultraviolet ray to green light ray, as well as a long wavelength region including infrared ray. Recently, it has been succeeded in oscillation of blue laser beam by using a Group II–VI compound semiconductor lattice-matching with a GaAs substrate. Oscillation of the blue laser beam is attained by the formation of quantum well active layers and the improvement of p-type doping technique. However, for controlling a transverse mode, a current constriction structure as used in an AlGaAs-based semiconductor laser is necessary. For forming a block layer to effect a current constriction, application of selective epitaxial growth technique is necessary.

For preparing the quantum well structure, it is necessary to precisely control the epitaxial growth rate and usually, molecular beam epitaxy (MBE) or metal organic vapor phase epitaxy (MOVPE) is conducted. Actually, when the above-mentioned epitaxy method is used, an abrupt hetero boundary is formed at the level of an atom layer. When such a structure is applied to a device, flatness of the hetero boundary has a great effect on device characteristics. Since a migration distance of compound molecules is short in the Group II–VI compound boundary, there is a problem such as worsening of the flatness. While selective epitaxial growth has been conducted in recent years for further optimizing a device structure, since selective epitaxial growth is extremely difficult by the usual MBE method, the MOVPE method or metal organic molecular beam epitaxy (MOMBE) method has been conducted for selective epitaxial growth. Since the selective epitaxial growth is a damageless process carried out at a relatively low temperature, there has a merit capable of obtaining a selective epitaxial growth region of high quality and obtaining a high performance device.

However, in order not to deposit polycrystals on a protection film, upon conducting selective epitaxial growth it is subjected to remarkable restrictions on conditions for vapor-phase epitaxy, crystal mixing ratio and mask width. Particularly, in a case of Zn-containing Group II–VI compound, there has been arisen such a problem that polycrystals are more apt to be deposited on a protection film as the mask width is greater, failing to obtain a desired structure.

As a result of earnest present inventors' studies for solving such a problem, it has been found that use of a halide gas and/or a halogen gas upon forming a heterostructure of a compound semiconductor or upon growing crystals selectively, can flatten the surface of a epitaxial growth layer and enables to conduct a vapor-phase epitaxy of crystals at high quality without depositing polycrystals on a mask over a wide range. On the basis of the finding, the present invention has been accomplished.

SUMMARY OF THE INVENTION

An object of the present invention is to provide a method of manufacturing a semiconductor capable of flattening the surface of an epitaxial growth layer, particularly, improving the flatness at a hetero boundary and having excellent device characteristics.

To accomplish the aim, in a first aspect of the present invention, there is provided a method of manufacturing Group II–VI compound semiconductor thin film by a vapor-phase epitaxy using an organic metal compound of Group II element and a hydride or an organic metal compound of Group VI element as the raw material, which comprises repeating alternate introduction of the organic metal compound of Group II element and a halide gas, a halogen gas or a mixture thereof.

In a second aspect of the present invention, there is provided a method of manufacturing a Group II–VI compound semiconductor thin film by a vapor-phase epitaxy using an organic metal compound of Group II element and a hydride or an organic metal compound of Group VI element as the raw material, which comprises adding a halide gas, a halogen gas or a mixture thereof into a gas for vapor-phase epitaxy.

DETAILED DESCRIPTION OF THE INVENTION

As a hydride of Group VI element used in the manufacturing method according to the present invention, those not containing halogen element are preferred, and hydrogen selenide ($H_2Se$) and hydrogen sulfide ($H_2S$) are used. As an organic metal compound of Group VI element used in the manufacturing method according to the present invention, dimethyl selenium and diethyl sulfide may be exemplified. As the organic metal compound of Group II element, those not containing halogen element are preferred, and dimethyl zinc (DMZ), bicyclo benziniel magnesium ($Cp_2Mg$), etc. are used.

There is no particular restriction on the halide gas and/or halogen gas. For example, HBr, HI, HF, HCl, $CCl_2F_2$ can be exemplified as the halide gas, and $Cl_2$, $I_2$, $F_2$, $Br_2$ and a mixture thereof can be exemplified as the halogen gas. It is preferred to use $Cl_2$ for a low temperature region and HCl for a high temperature region.

In the first aspect of the present invention, in a case of alternately supplying an organic metal compound of Group II element and a halide gas and/or halogen gas, the amount of the halide gas and/or halogen gas used is preferably smaller than that used in usual etching for the surface of a semiconductor thin film, with no particular restriction. The amount is determined while considering the size of a chamber, a temperature for vapor-phase epitaxy or the like. An example of a preferred amount of the halide gas and/or halogen gas to be used is approximately equimolar to that of the raw material gas.

Further, the total pressure of the gas to be supplied is preferably less than an ordinary pressure and, more preferably from 30 to 100 Torr.

As the temperature for vapor-phase epitaxy according to the present invention, any temperature condition generally used for vapor-phase epitaxy of Group II–VI compounds may be used. For example, a temperature from 300° to 500° C. is preferred.

In the first aspect, a gaseous raw material for the Group II element, and halide gas and/or halogen gas are alternately introduced into a chamber, in which the time for supplying the gaseous raw material for the Group II element for once is preferably less than one minute and, more preferably, from 1 to 30 sec. If the supplying time exceeds 1 minute, it is difficult to obtain the effects of the present invention such as flattening of the growth surface. The supply of the gaseous raw material for the Group II element is interrupted and then the halide gas and/or halogen gas is supplied. The time for supplying the halide gas and/or halogen gas is also preferably less than 1 minute, particularly preferably from 1 to 30 sec. There is no particular restriction for the period of time during which neither the gaseous raw material for the Group II element nor the halide gas and/or halogen gas is supplied upon switching the supply thereof. It is preferred to avoid mixing of the gaseous raw material for the Group II element, and the halide gas and/or halogen gas on the growth surface. From a practical point of view, since the workability is worsened as the switching period is longer, it is preferably less than 10 sec, more preferably 1 to 10 sec.

The manufacturing method of the first aspect is effective to usual vapor-phase epitaxy of Group II–VI compound semiconductor thin film, and it is particularly suitable to the formation of a Zn-containing Group II–VI compound semiconductor thin film. As the starting material containing zinc, while various known materials can be used depending on the epitaxy method, but dialkyl zinc is preferred for the MOCVD method. Also in this case, HCl or $Cl_2$ is preferred as the halide gas and/or halogen gas.

Usually, in a case of doping a Group II–VI compound, halogen is used as a n-type dopant incorporated in the Group IV site. Then, the method of the first aspect of alternate introduction of the raw material for the Group II element and the halide gas and/or halogen gas into the chamber can provide the effect of the present invention more remarkably as compared with a case of simultaneously supplying the raw material for the Group II element and the halide gas and/or halogen gas, for preventing intrusion of halogen in the Group II site.

Figure 7:
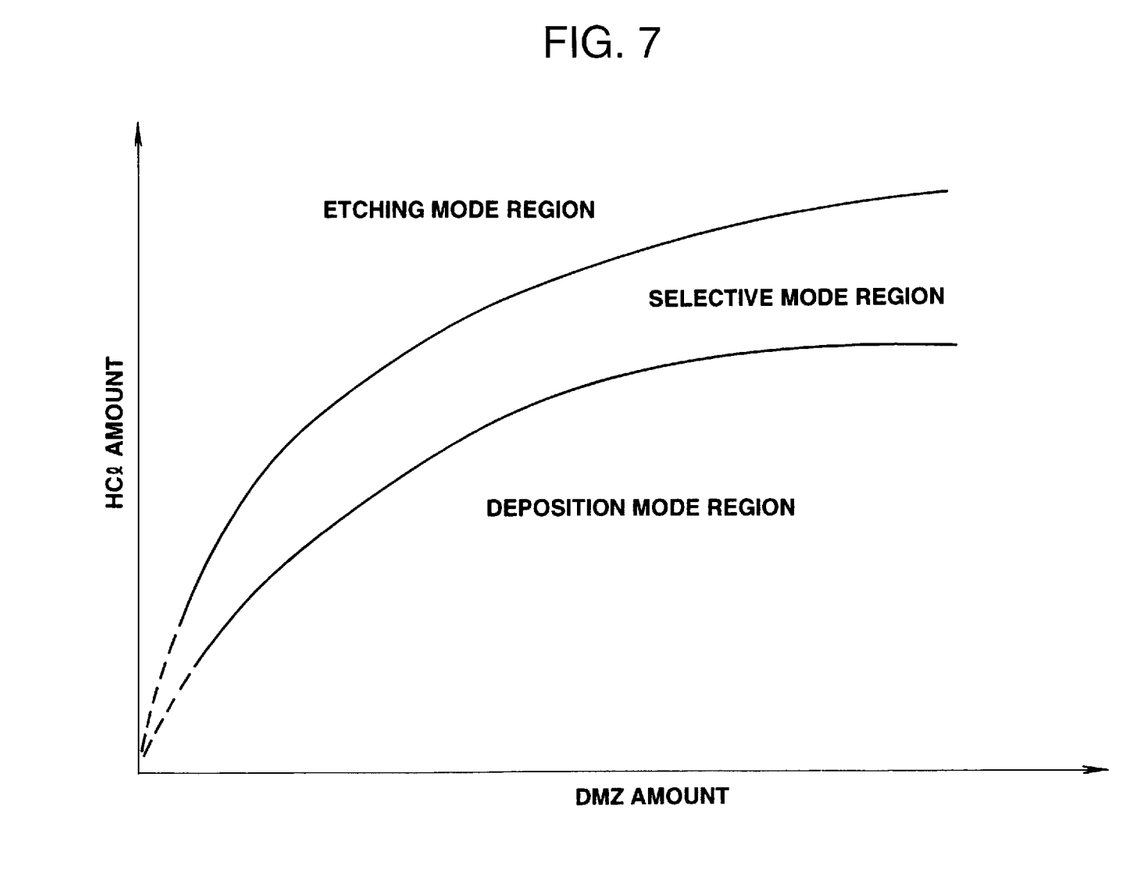
FIG. 7 is an explanatory view of a selective mode in the present invention.

In a case of the second aspect of the present invention of adding a halide gas and/or halogen gas into the gas for vapor-phase epitaxy, the amount of the halide gas and/or halogen gas used varies greatly depending on the size of the chamber, the temperature for vapor-phase epitaxy or the like and it is usually less than the amount of the hydride not containing the halogen element and that of the organic metal compound not containing the halogen element. Then, a quantitative relation between both of them is determined so as to avoid an etching mode region in which vapor-phase epitaxy is stopped and etching proceeds, or a deposition mode region in which polycrystals are deposited on the mask, so that it enters a selective mode region in which crystals are grown but polycrystals are not deposited on the mask. FIG. 7 shows this relation by means of the flow rate of DMZ and HCl. Since concrete values differ as described previously, depending on the size of the chamber, temperature for vapor-phase epitaxy and the material used, it may be determined properly by those skilled in the art considering the actual apparatus employed. A preferred example of the amount used of the halide gas and/or halogen gas is approximately equimolar to that of the raw material gas. Since the etching rate is lowered as the temperature lowers, it is preferred to increase the amount of the halide gas and/or halogen gas used if the temperature is low.

Further, the total pressure of the gas supplied is preferably lower than an ordinary pressure, more preferably from 30 to 100 Torr.

For the temperature for vapor-phase epitaxy, any condition generally used for the vapor-phase epitaxy of the Group II–VI compound can be applied. For instance, a temperature from 300° to 500° C. is preferred.

The manufacturing method according to the present invention is effective to the vapor-phase epitaxy of usual Group II–VI compound semiconductor thin films and it is particularly suitable to the vapor-phase epitaxy of a Zn-containing Group II–VI compound semiconductor thin film. As the Zn-containing starting material, various known materials can be used depending on the epitaxy method, and a dialkyl zinc is preferred for the MOCVD method. Also in this case, HCl or $Cl_2$ is preferred as the halide gas and/or halogen gas.

As another aspect of the present invention, there can be mentioned a combination of the first aspect and the second aspect, that is, a method of intermittently supplying a halide gas and/or halogen gas, while supplying the raw material gas for vapor-phase epitaxy, or a method of changing the flow rate of an organic metal compound gas of the Group II element, while flowing a halide gas and/or halogen gas and a gas of a hydride of a Group VI element at a constant flow rate within a range. Such method can also provide the same effect as that in the first and the second aspects described above.

In the growth of the group II–VI compound semiconductor thin film, when a gaseous raw material for the Group II element and a halide gas and/or halogen gas are introduced alternately at least for once into a chamber, it is possible for crystals under conditions for vapor-phase epitaxy which are substantially identical with those in the existent MOVPE method to flatten the hetero boundary, thereby improving the flatness of the surface morphology or facet surface or growing crystals at high quality without deposition of polycrystals on the mask over a wide range.

As has been described above, when a halide gas such as HCl and/or halogen gas is added during production of a compound semiconductor according to the present invention, it is possible for flattening the hetero boundary, or growing crystals at high quality without depositing polycrystals on the mask over a wide range. In the present invention, although the epitaxial growth rate is reduced slightly due to the addition of a minor amount of HCl, it possesses sufficient reproducibility and controllability of existent thin film growing and this is a practically effective. Further, although the explanation has been made with respect to MOVPE in the examples, the method is not particularly restricted only to the MOVPE method but other vapor-phase epitaxy methods such as an MBE method is also effective.

EXAMPLE

The present invention will be explained below using examples but the present invention is not restricted only to the examples unless it does not exceed the gist thereof.

Example 1

Figure 1:
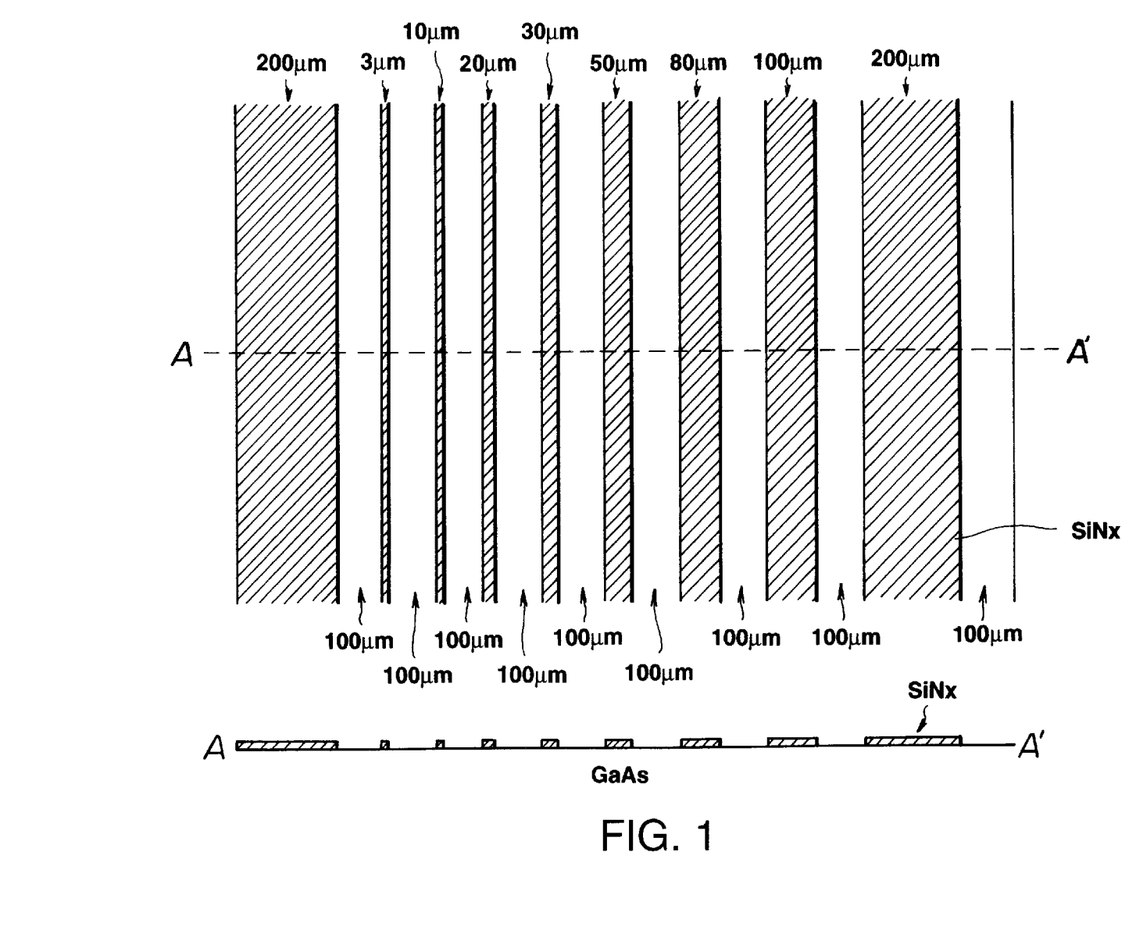
FIG. 1 is an explanatory view for a stripe pattern used in examples of the present invention.

After depositing a silicon nitride (SiNX) film to 10 nm in thickness by a plasma CVD process on a GaAs substrate, GaAs was partially exposed by using photolithography. The distance between exposed GaAs portions adjacent to each other was varied from 2 $\mu$m to 1 mm. FIG. 1 shows a state of the stripe pattern.

Figure 2A:
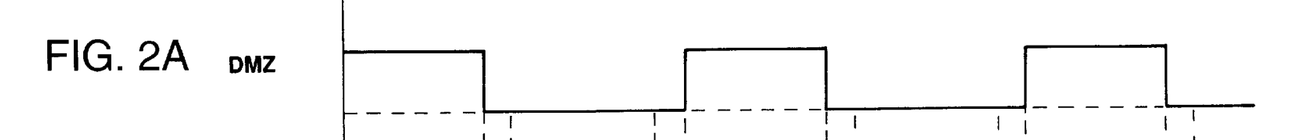
FIG. 2 is an explanatory view of a gas flow program used in examples of the present invention.
Figure 2B:
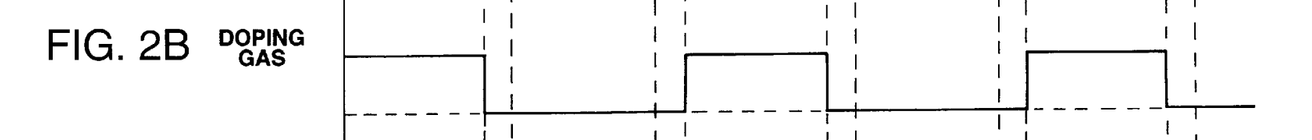
Figure 2C:
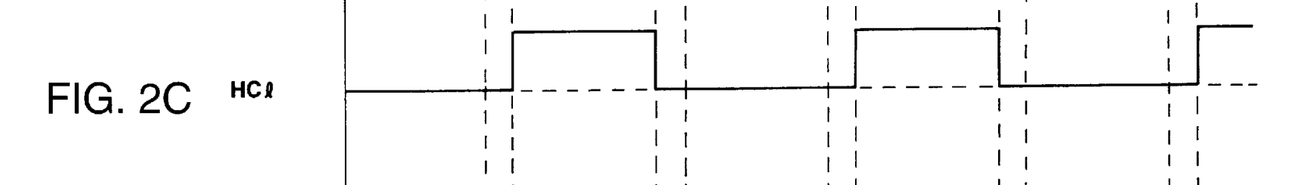

A ZnSe layer was grown to 1 $\mu$m in thickness on the substrate by a MOCVD method in accordance with the gas flow program shown in FIG. 2. There were used dimethyl zinc (DMZ) as the gaseous raw material for the Group II organic metal compound, hydrogen selenide (H$_2$Se) as gaseous raw material for the Group VI element and HCl as the halide gas. The temperature was 700° C. and the pressure was 76 Torr. The HCl and DMZ were supplied at an equimolar. The epitaxial growth rate of ZnSe not covered with the SiN$_x$ film was 1 $\mu$m/hr.

The gas flow program shown in FIG. 2 was executed in such a manner of at first flowing hydrogen selenide and DMZ in a H$_2$ atmosphere as a carrier gas for 5 sec, interposing one sec of interval, flowing HCl for 5 sec and then further interposing on e sec of interval as one cycle and then return to the first step of flowing DMZ for 5 sec. The process was repeated for 180 cycles. Meanwhile, hydrogen selenide and H$_2$ as the carrier gas were always supplied continuously.

As a result, while formation of ZnSe nuclei was slightly observed on the SINX film of not less than 500 $\mu$m in width, no formation of ZnSe was observed at all on the SiN$_x$ film having of not more than 500 $\mu$m in width, and AlAs was grown selectively only on the exposed GaAs.

Comparative Example 1

Figure 3A:
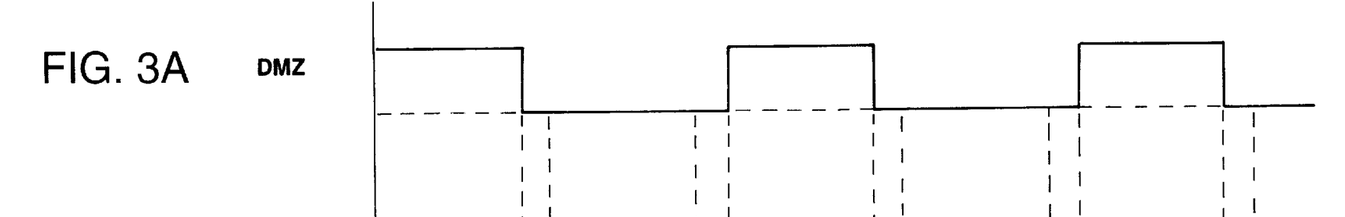
FIG. 3 is an explanatory view of a gas flow program used in a comparative example of the present invention.
Figure 3B:
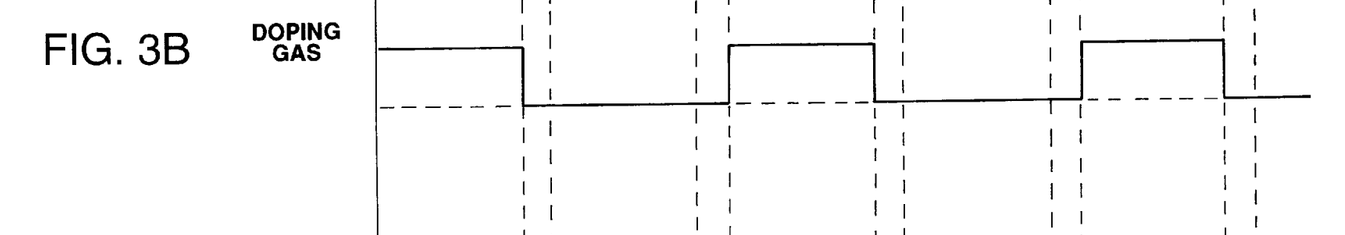
Figure 3C:
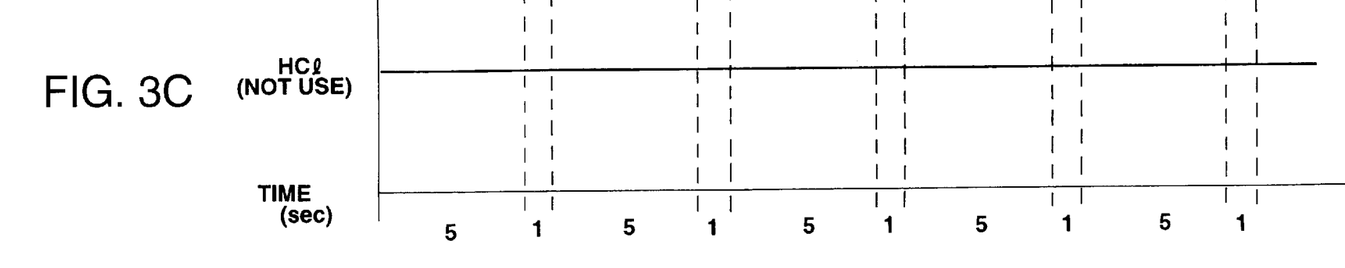

ZnSe was grown in the same manner as in the Example 1 except for using a gas flow program not supplying HCl as shown in FIG. 3. As a result, growth of ZnSe polycrystals was observed substantially over the entire surface on all of the SiN$_x$ films.

Example 2

Figure 4:
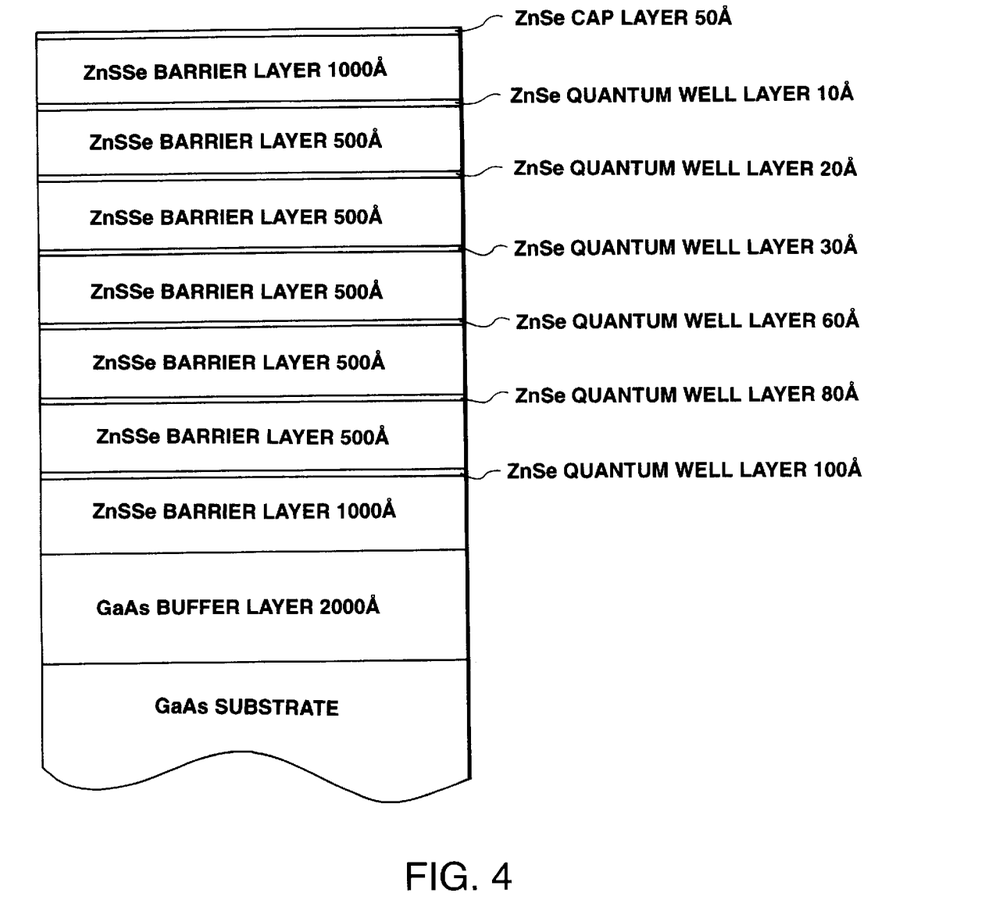
FIG. 4 is a an explanatory view for a hetero structure used in Example 1.

As shown in FIG. 4, a hetero-structure having six ZnSe quantum wells of 10 Å, 20 Å, 30 Å, 60 Å, 80 Å, and 100 Å in well width, respectively, were prepared using ZnSSe as barrier layers on a Cr-doped GaAs (100) substrate by a MOVPE method. In this case, dimethyl zinc (DMZ), hydrogen selenide (H$_2$Se) and hydrogen sulfide (H$_2$S) were used as starting material gas. Further, the total flow rate was 7.7 SLM, the temperature was 550° C., the pressure was 35 Torr, and the epitaxial growth rate was about 1 $\mu$m/h. Under the epitaxy conditions described above, sample (A) in which 0.25 sccm of HCl was added and a sample (B) in which HCl was not added (epitaxy method in the prior art) during vapor-phase epitaxy of the ZnSe quantum well layer and the ZnSSe barrier layer, were prepared. Reduction of the epitaxial growth rate due to the addition of HCl at 0.25 sccm under the epitaxy conditions was only 5%. Photoluminescence (PL) measurement was conducted at 4.2K for the samples to observe emission of light from the quantum wells. While the PL intensity was substantially identical both for the samples (A) and (B), the PL semi-value width was greatly decreased in the sample (A). The PL semi-value width has a close concern with the flatness of the hetero boundary at both ends of the quantum well, and the semi-value width is smaller as the hetero boundary is more flat. From the foregoings, it may be considered that migration of the Zn-containing compound was promoted and a flat hetero boundary was formed by the addition of HCl.

Example 3

Figure 5:
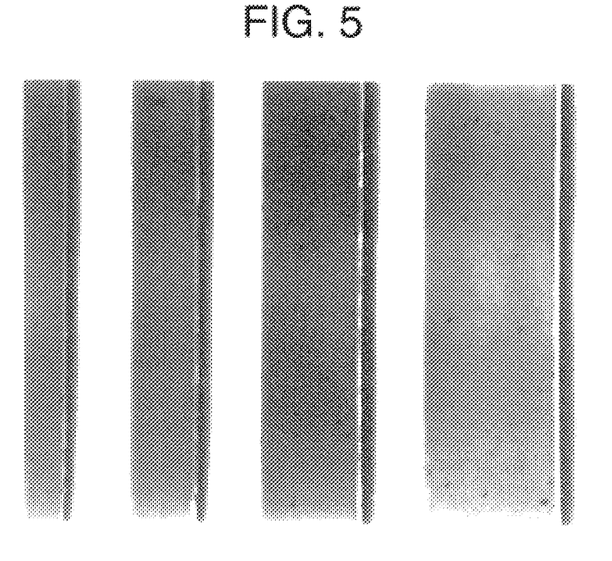
FIG. 5 is an optical microscopic photograph for metal crystals showing the surface state of a sample A in Example 3.
Figure 6:
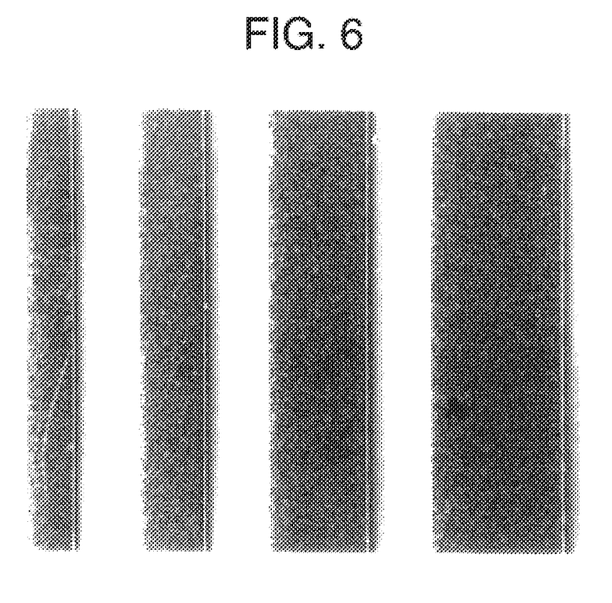
FIG. 6 is an optical microscopic photograph for metal crystals showing the surface state of a sample B in Example 3.

A ZnSe layer of about 1 $\mu$m in thickness was caused to vapor-phase epitaxy on a GaAs substrate having a stripe pattern of a SiN$_x$ films with the width varied on every 100 $\mu$m (5 $\mu$m to 200 $\mu$m) as shown in FIG. 1 by the MOVPE method. In this instance, dimethyl zinc (DMZ) and hydrogen selenide (H$_2$Se) were used as the raw material gas and the mol number of DMZ and H$_2$Se supplied were set as 2×10$^{-5}$ mol/min and 4×10$^{-5}$ mol/min, respectively. Further, the total flow rate was 7.7 SLN, the temperature was 650° C., the pressure was 76 Torr and the epitaxial growth rate was about 2 $\mu$m/h. FIGS. 5 and 6 show optical microscopic photographs for portions of the wafer surfaces after growing with respect to a sample in which HCl was added at 0.5 sccm (A) and a sample (B) in which HCl was not added (epitaxy method in the prior art) during the vapor-phase epitaxy. In the drawings, regions appearing white are portions in which ZeSe was grown on GaAs, while regions appearing black are SiN$_x$ film and white dots on the SiN$_x$ film are ZnSe polycrystals. In the sample (B) shown in FIG. 6, a number of polycrystals were deposited over the entire surface of the SiN$_x$ film even on the stripe of SiN$_x$ films of large width (100 $\mu$m in width) in a case of growing a ZnSe layer in the sample (B) shown in FIG. 6. It has been reported for the usual MOVPE method that migration of the Zn-containing compound is rather slow and the reactivity with the protection film is high, so that selective epitaxial growth for ZnSe is rather difficult even if vapor-phase epitaxy is carried out under a reduced pressure of several tens of Torr. The existent epitaxy method provide a similar result also in this case. On the other hand, in the sample (A) shown in FIG. 5, no deposition of polycrystals was observed on the stripe of the SiN$_x$ films of 200 $\mu$m width in a case of the vapor-phase epitaxy of the ZnSe layer. From the foregoings, it is considered that migration of the Zn-containing compound was promoted with addition of HCl, which enabled favorable selective epitaxial growth.

What is claimed is:

1. A method of manufacturing a Group II–VI compound semiconductor thin film by a vapor-phase epitaxy using an organic metal compound of Group II element and a hydride or an organic metal compound of Group VI element as a raw material, which comprises repeating alternate introduction of an organic metal compound of Group II element and a halide gas, a halogen gas or a mixture thereof, the total pressure of the gas supplied being lower than an ordinary pressure, the hydride or organic metal compound of Group VI element being introduced into the growth chamber during a period in which said Group II organic metal compound is being introduced, and wherein the Group II–VI compound semiconductor thin film grows during said period.

2. A method of manufacturing a Group II–VI compound semiconductor thin film by a vapor-phase epitaxy using an organic metal compound of Group II element and a hydride or an organic metal compound of Group VI element as a raw material, which comprises adding a halide gas, a halogen gas or a mixture thereof to a gas for vapor-phase epitaxy, the total pressure of the gas supplied being lower than an ordinary pressure, the hydride or organic metal compound of Group VI element being introduced into the growth chamber during a period in which said Group II organic metal compound is being introduced, and wherein the Group II–VI compound semiconductor thin film grows during said period.

3. A manufacturing method as defined in claim 1 or 2, wherein an organic metal compound of Group II element not containing a halogen element and a hydride or an organic metal compound of Group VI element not containing a halogen element are used as the raw material.

4. A manufacturing method as defined in claim 1 or 2, wherein the vapor-phase epitaxy is conducted in a selective epitaxial growth region.

5. A method of claim 1 or 2 wherein the halide gas, halogen gas or mixture thereof is one or more materials selected from the group consisting of HBr, HI, HF, Hcl, $CCl_2F_2$, $Cl_2$, $I_2$, $F_2$ and $Br_2$.

6. A method of claim 1 or 2 wherein the Group VI element does not contain a halogen element.

7. A method of claim 1 or 2 wherein the Group VI element is hydrogen selenide or hydrogen sulfide.

8. A method of claim 1 or 2 wherein the Group II element does not contain a halogen element.

9. A method of claim 1 or 2 wherein the Group II element is dimethyl zinc or bicylco benziniel magnesium.

10. A method of claim 1 or 2, wherein more than one single molecule layer is formed in a complete cycle of gas flow.

11. A method of manufacturing a Group II–VI compound semiconductor thin film by a vapor-phase epitaxy using an organic metal compound of Group II element and a hydride or an organic metal compound of Group VI element as a raw material, which comprises repeating alternate introduction of an organic metal compound of Group II element and a halide gas, a halogen gas or a mixture thereof and wherein the vapor-phase epitaxy is conducted in a selective growth region.

12. A method of manufacturing a Group II–VI compound semiconductor thin film by a vapor-phase epitaxy using an organic metal compound of Group II element and a hydride or an organic metal compound of Group VI element as a raw material, which comprises adding a halide gas, a halogen gas or a mixture thereof to a gas for vapor-phase epitaxy and wherein the vapor-phase epitaxy is conducted in a selective growth region.

\* \* \* \* \*